US012063756B2

(12) United States Patent
Robinson et al.

(10) Patent No.: US 12,063,756 B2
(45) Date of Patent: Aug. 13, 2024

(54) MODULAR THERMAL HEAT SINK DEVICE

(71) Applicant: Nexalus Limited, Cork (IE)

(72) Inventors: Anthony Robinson, Cork (IE); Cathal Wilson, Cork (IE); Kenneth O'Mahony, Cork (IE)

(73) Assignee: Nexalus Limited, Cork (IE)

( * ) Notice: Subject to any disclaimer, the term of this patent is extended or adjusted under 35 U.S.C. 154(b) by 0 days.

(21) Appl. No.: 18/037,163

(22) PCT Filed: Nov. 24, 2021

(86) PCT No.: PCT/EP2021/082822
§ 371 (c)(1),
(2) Date: May 16, 2023

(87) PCT Pub. No.: WO2022/112329
PCT Pub. Date: Jun. 2, 2022

(65) Prior Publication Data
US 2023/0328920 A1 Oct. 12, 2023

(30) Foreign Application Priority Data
Nov. 27, 2020 (GB) .................................... 2018706

(51) Int. Cl.
*H05K 7/20* (2006.01)
*G06F 1/20* (2006.01)
(52) U.S. Cl.
CPC .......... *H05K 7/20254* (2013.01); *G06F 1/20* (2013.01); *G06F 2200/201* (2013.01)
(58) Field of Classification Search
None
See application file for complete search history.

(56) References Cited

U.S. PATENT DOCUMENTS 6,367,543 B1   4/2002 Calaman et al.
7,142,422 B2*  11/2006 Lee .................. H01L 23/467
                                              174/16.3

(Continued)

FOREIGN PATENT DOCUMENTS

CN    109244052      1/2019
WO    20200210783   10/2020

OTHER PUBLICATIONS

ISR/WO from PCT/EP2021/082822 Search and Examination Report from Application No. GB2018706.8.

*Primary Examiner* — Courtney L Smith
(74) *Attorney, Agent, or Firm* — Stephen T. Scherrer; Monique A. Morneault; Scherrer Patent & Trademark Law, P.C.

(57) ABSTRACT

A modular liquid-cooled thermal heat sink device configured to thermally engage with a thermal substrate. The device comprises a housing assembly having a body defining a volume, the housing assembly comprising a thermal cooling plate configured to be in thermal contact with the thermal substrate, a fluid inlet and a fluid outlet, the housing assembly being configured to facilitate fluid circulation within the body to effect an operative cooling of the thermal substrate through the thermal cooling plate, the body comprising a plurality of first engaging features spaced about a perimeter of the body. The device further comprises a plurality of removable arms each comprising a first and second end, each of the plurality of arms being configured to mate with the body at a respective one of the plurality of first engaging features, wherein each of the first ends defines a second engaging feature dimensioned to cooperate and form an engagement with a respective first engaging feature, and wherein each of the second ends is configured to effect an operative fixing of the device to a supporting surface (Continued)

through application of a force on each of the second ends, the force being perpendicular to the supporting surface.

15 Claims, 10 Drawing Sheets

(56) References Cited

U.S. PATENT DOCUMENTS

| | | | | |
|---|---|---|---|---|
| 7,269,013 | B2* | 9/2007 | Chen | H01L 23/427 |
| | | | | 361/709 |
| 9,250,024 | B2* | 2/2016 | Campbell | F28F 3/048 |
| 9,544,988 | B2* | 1/2017 | Suzuki | F28D 15/0266 |
| 9,565,787 | B2* | 2/2017 | Ho | H01L 23/36 |
| 10,736,233 | B1* | 8/2020 | Messer | H05K 7/20272 |
| 10,887,978 | B2* | 1/2021 | Johansen | H01L 23/4275 |
| 11,129,305 | B2* | 9/2021 | Raeth | H05K 7/20409 |
| 11,706,906 | B2* | 7/2023 | Gradinger | F28D 1/0206 |
| | | | | 361/699 |
| 2003/0067746 | A1 | 4/2003 | Ishimine | |
| 2007/0034359 | A1* | 2/2007 | Liu | F28D 1/05366 |
| | | | | 165/104.31 |
| 2009/0260777 | A1 | 10/2009 | Attlesey | |
| 2009/0311894 | A1 | 12/2009 | Kim | |
| 2009/0314473 | A1* | 12/2009 | Yoshikawa | H01L 23/4006 |
| | | | | 165/104.19 |
| 2010/0097766 | A1 | 4/2010 | Wu et al. | |
| 2014/0150993 | A1 | 6/2014 | Liu et al. | |
| 2016/0327996 | A1 | 11/2016 | Sasabe et al. | |
| 2017/0045300 | A1 | 2/2017 | Boday et al. | |
| 2020/0120790 | A1 | 4/2020 | Wu et al. | |
| 2020/0352053 | A1* | 11/2020 | Mizerak | H01L 23/4735 |

* cited by examiner

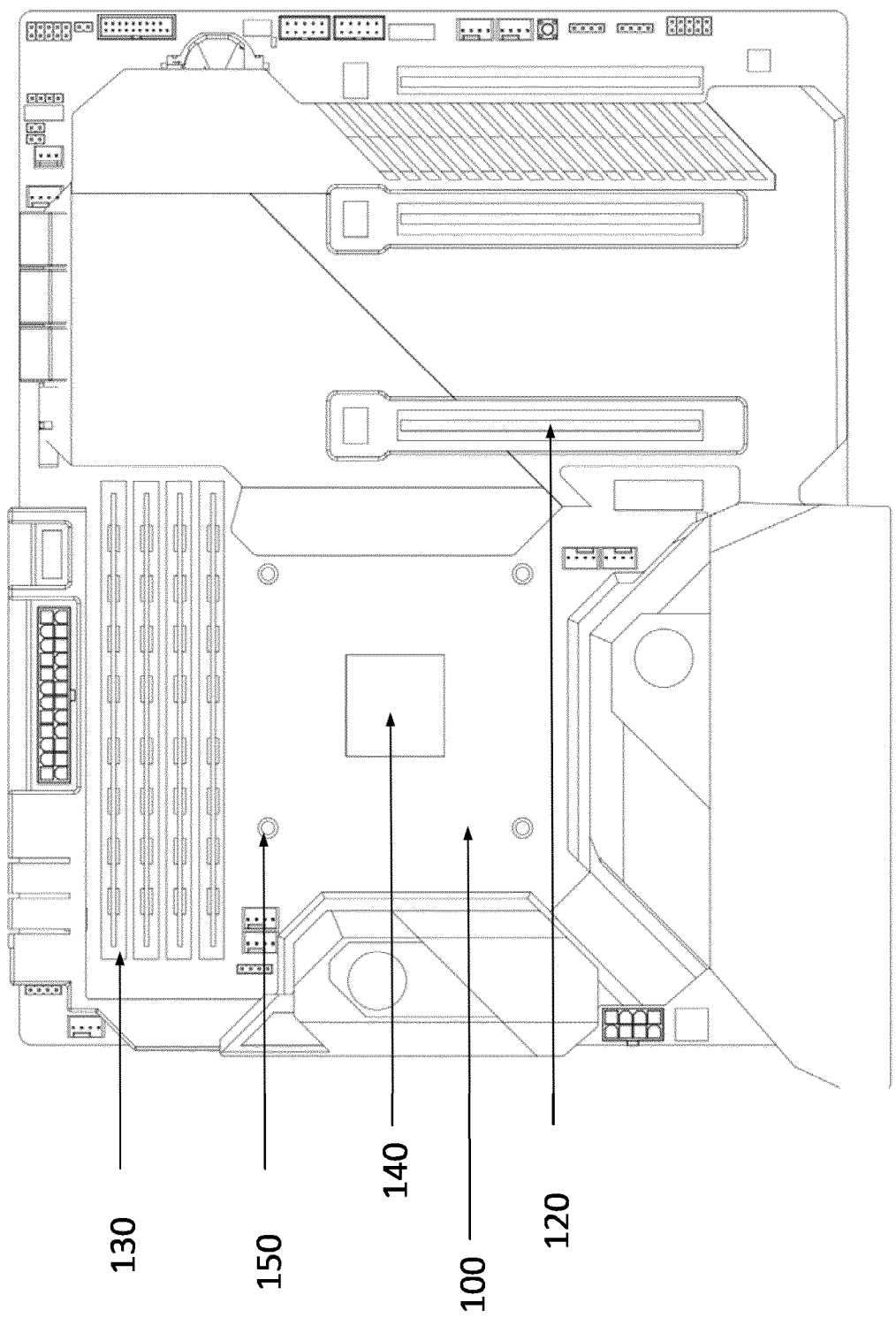

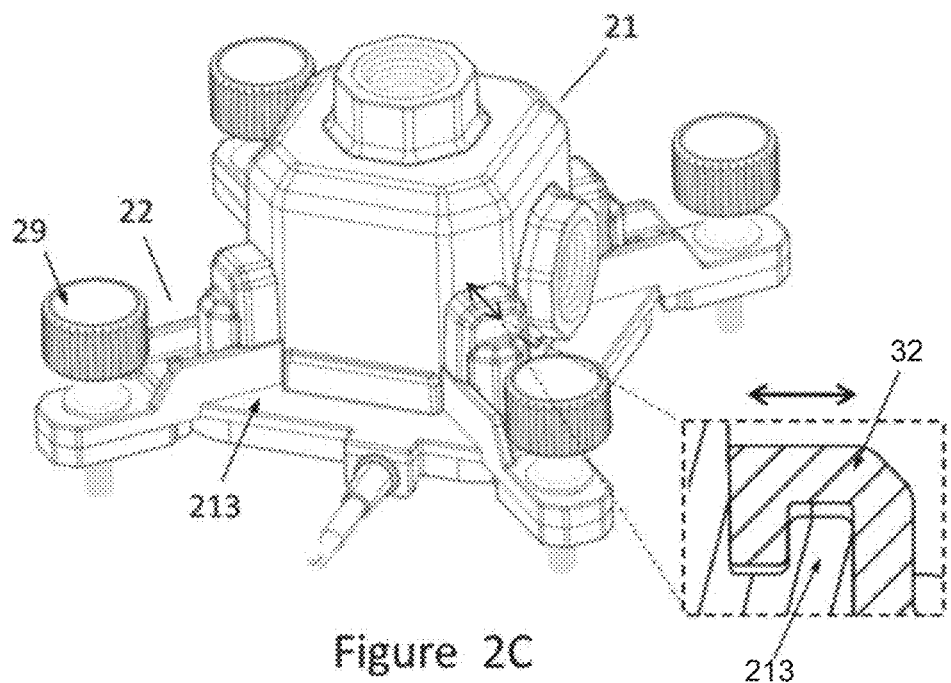
Figure 2C
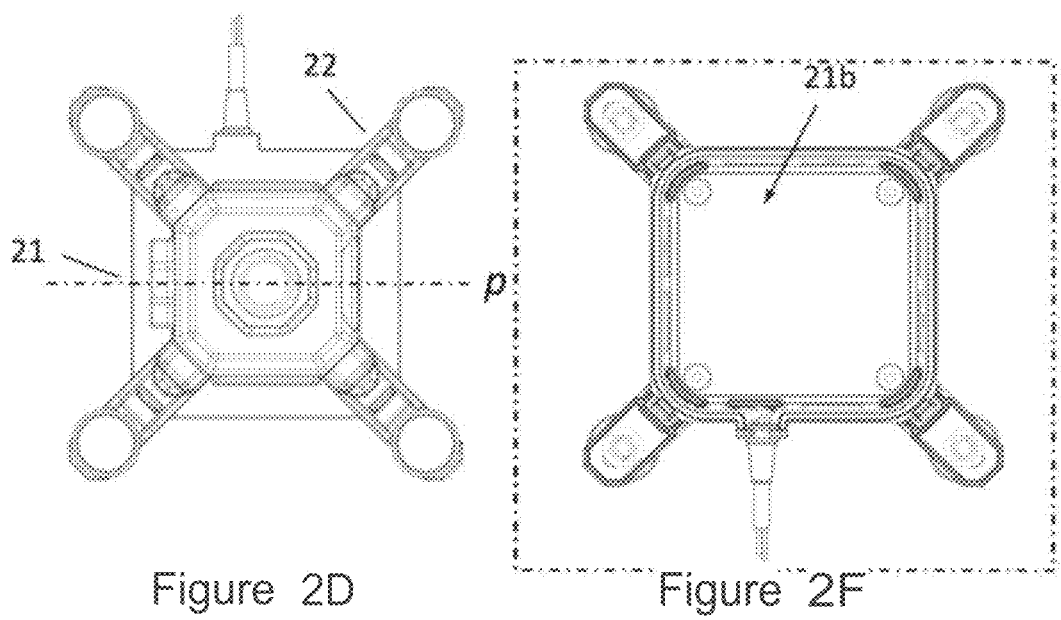
Figure 2D
Figure 2F

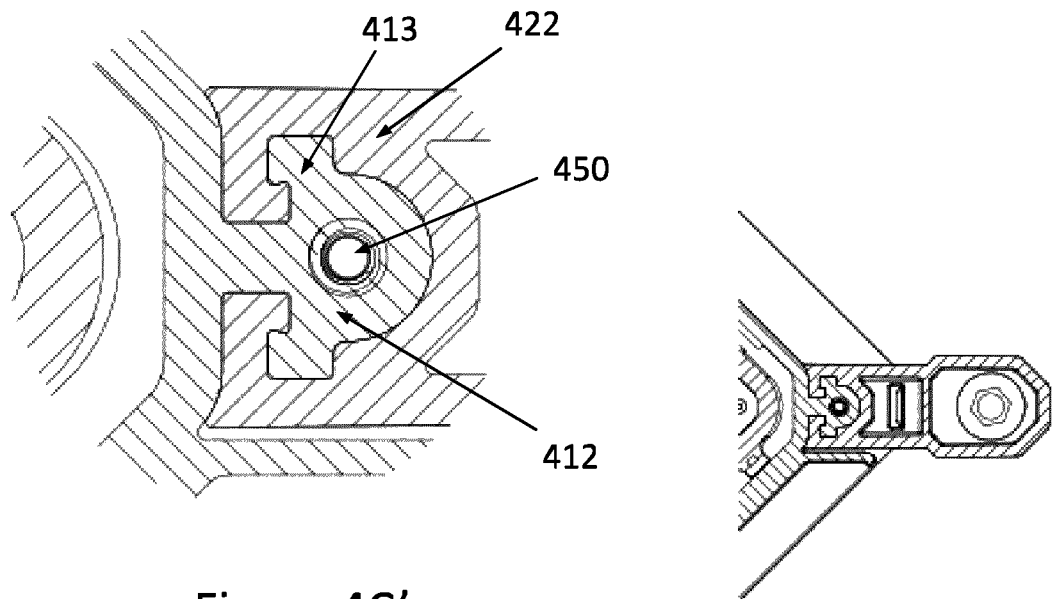
Figure 4C'
Figure 4C
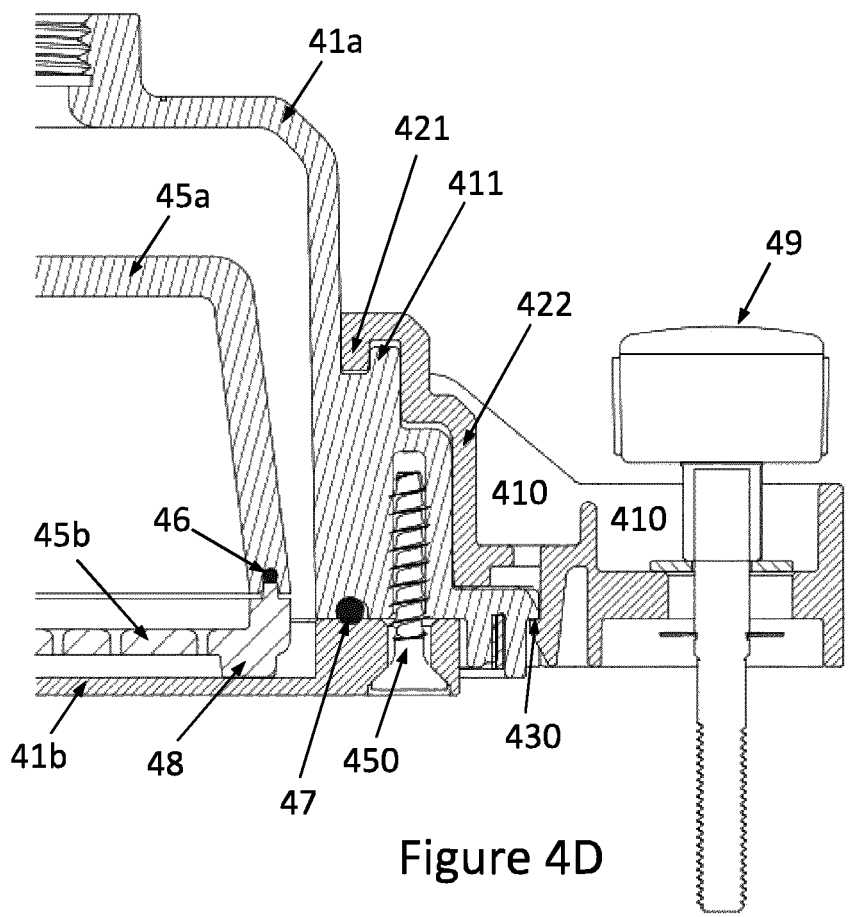
Figure 4D

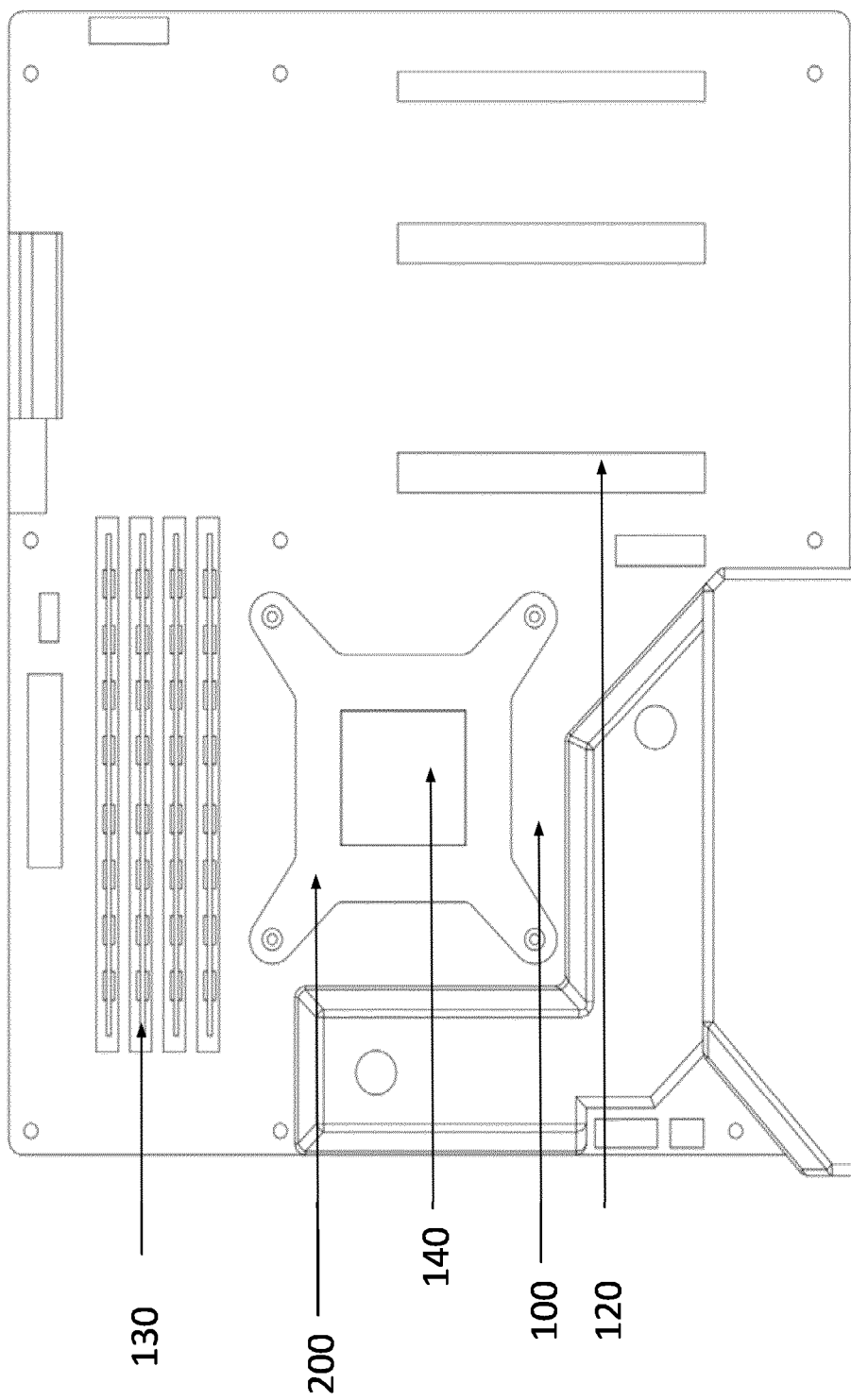

MODULAR THERMAL HEAT SINK DEVICE

FIELD

The present application relates to heat exchangers for cooling computer components.

BACKGROUND

Removing waste heat generated by electronic components is critical for ensuring performance of computing systems. Various types of computer coolers have been developed based on different cooling mechanisms. In general, existing coolers are either air-based or liquid-based. Between the two, liquid-based cooling provides advantages over air-based cooling due to better thermophysical properties, such as the higher thermal conductivity, density and specific heat capacity of liquid compared with air. Therefore, liquid-based cooling can provide a more compact cooling solution with higher cooling effectiveness and lower power consumption.

Some relatively high-powered and computational expensive components such as central processing units (CPUs) and graphics processing units (GPUs) can generate a large amount of heat during operation and thus may require targeted cooling. A CPU forms part of a CPU card and a GPU forms part of a graphics card, both are printed circuit board packed with a large number of electronic across a limited board surface area. The components are further electrically connected using conductive tracks, pads, and other features. Taking a motherboard as an example; it typically comprises at least one CPU chip, various memory chips, memory controllers, input/output systems, and interface connectors, etc. Therefore, it can be challenging to mount a designated cooler for targeted cooling of a specific component on a densely packed computer board or card to achieve the desired cooling effectiveness.

CPU and GPU chips may adopt various shapes and sizes. To achieve an effective targeted cooling, it is desirable for the cooling device, especially the area where convection cooling is effected to match the shape and size of the heat-dissipating surface of the chips to improve cooling effect and save space.

Furthermore, printed circuit boards are configured to adopt a large variety of designs, sizes, and/or layouts of components. Again, taking motherboards as an example, a specific type of CPU model may be used in the manufacture of different motherboards. Although a CPU cooler may have been designed to suit the specific CPU model, since the motherboard that holds the CPU may adopt different designs and layouts, especially that of the peripheral components, different fixing or mounting arrangements may be needed.

Therefore, there exists a need for a cooling device that can be adapted for cooling of electronic components of various shapes and sizes and be compatible with different circuit board designs.

In addition, in order for a cooling device to achieve the desired cooling effectiveness, a reliable thermal contact with the cooling target component is critical. A reliable thermal contact requires robust and balanced physical coupling between the electronic component and the cooling surface of the cooler. The thermal coupling may be enhanced using a thermal interface material.

Further issues exist in effecting a robust fixing. Electronic components on a computer board/card are not typically designed to endure high mechanical impacts due to, for example, their delicate features and the fabrication material dictated by functionality. This makes it difficult to robustly mount a cooler without causing damage to or affecting the performance of not only the cooling target component but also its surround electronic components.

A further issue exists in achieving quality coupling between an electronic component surface and a cooling surface. This is particularly the case if the mounting is performed by consumers which is becoming more common with personalisation of computing equipment in, for example, the gaming industry.

Therefore, there further exists a need for a cooling device that can be robustly mounted on a circuit board to facilitate required coupling between the component and the cooler to achieve effective cooling performance.

The present teaching addresses at least some of the issues that are present in the existing cooling devices.

SUMMARY

The present invention is defined by the independent claims. Further optional features are defined in the dependent claims.

Accordingly, the present teaching provides a modular liquid-cooled thermal heat sink device configured to thermally engage with a thermal substrate.

According to an embodiment of the present teaching, the device comprises a housing assembly having a body defining a volume. The housing assembly may comprise a thermal cooling plate configured to be in thermal contact with the thermal substrate, a fluid inlet and a fluid outlet. The housing assembly may be configured to facilitate fluid circulation within the body to effect an operative cooling of the thermal substrate through the thermal cooling plate. The body comprises a plurality of first engaging features spaced about a perimeter of the body. The device comprises a plurality of removable arms each comprising a first and second end. Each of the plurality of arms may be configured to mate with the body at a respective one of the plurality of first engaging features. Each of the first ends defines a second engaging feature dimensioned to cooperate and form an engagement with a respective first engaging feature. Each of the second ends is configured to effect an operative fixing of the device to a supporting surface through application of a force on each of the second ends, the force being perpendicular to the supporting surface.

According to some embodiments, each of the first and second engaging features may be configured such that, on fixing the device to the supporting surface, the force reinforces the engagement between the arms and the body.

According to some embodiments, the housing assembly may comprise an outer housing and an inner chamber, the outer housing defining the body, the inner chamber being configured to detachably coupled to the outer housing.

According to some embodiments, the body of the outer housing may comprise a housing upper portion and a housing lower portion, the housing lower portion comprising the thermal cooling plate, the housing upper and lower portions being configured to releasably engaged with each other to form a housing liquid-tight engagement.

According to some embodiments, on fixing the device to the supporting surface, the force may reinforce the housing liquid-tight engagement formed between the housing upper and lower portions.

According to some embodiments, the inner chamber may comprise a chamber upper portion and a chamber lower portion configured to releasably engage with each other to form a chamber liquid-tight engagement. The chamber lower portion may comprise an orifice region configured to facilitate passage of a fluid to be in thermal contact with the thermal cooling plate to effect the operative cooling.

According to some embodiments, the inner chamber and the outer housing may be releasably coupled to each other such that, on fixing the device to the supporting surface, the force reinforces the chamber liquid-tight engagement formed between the chamber upper and lower portions.

According to some embodiments of the present teaching, the device may comprise one or more spacers between the chamber lower portion and the housing lower portion to create a gap for facilitating a flow of the fluid that has passed through the orifice region, the one or more spacers configured to facilitate the reinforcement of the chamber liquid-tight engagement.

According to some embodiments, the orifice region may define an effective cooling region, the effective cooling region is dimensioned to substantially overlap the surface area of the thermal substrate.

According to some embodiments, each second engaging feature may define a groove and the first engaging feature defines a projection dimensioned to be at least partially received within the groove.

According to some alternative embodiments, each second engaging feature may define a projection and the first engagement feature defines a groove dimensioned to receive the projection.

According to some embodiments, the groove and the projection may be dimensioned such that the formed engagement locks the position of the respective arm relative to the housing assembly.

According to some embodiments, the groove may be a blind groove comprising a stop end and a through end. The projection may comprise a free end configured to fit and abut the stop end of the blind groove. The groove and the projection may be configured such that on fixing the device to the supporting surface, the force causes the stop end of the blind groove and the free end of the projection to press against each other to reinforce the engagement formed between the respective arm and the body.

According to some embodiments, the groove and the projection may each be dimensioned to form an elongated shape defining a longitudinal axis substantially perpendicular to the thermal cooling plate. The engagement may be a slidable engagement between the projection and the groove along the longitudinal axis.

According to some embodiments of the present teaching, the application of the force on each of the second ends of the plurality of removable arms may be effected by a respective torque screw of a plurality of torque screws.

According to some embodiments, on fixing the housing assembly to the supporting surface to facilitate a thermal contact between the thermal cooling plate and the thermal substrate, a lower surface of each removable arm may be suspended over the supporting surface.

According to some embodiments, the housing upper portion may comprise an external flange along the rim of the outer housing. Each of the plurality of removable arms may comprise a middle portion defined between the first end and second end. The middle portion may be configured such that on effecting the operative fixing of the device to the supporting surface, a lower surface of the middle portion presses against an upper surface of the external flange to simultaneously effect some or all of the aforementioned reinforcements.

According to some embodiments, at least two of the plurality of arms may be in different shape and/or dimensions.

According to some embodiments, the plurality of toque screws may be configured to operatively tighten to a specific torque.

According to some embodiments, a first torque screw of the plurality of torque screws may be configured to be tightened to a first specific torque. A second torque screw of the plurality of torque screws may be configured to be tightened to a second specific torque different from the first torque.

In summary, the device according to the various embodiments described herewith provides a controlled coupling between the heat sink device and the thermal substrate for improved cooling performance. The modular configuration allows the device to be conveniently modified and adapted to suit cooling of electronic components of various sizes or shapes as well as for fitting onto circuit boards of various layouts. The unique fixing and mounting mechanisms facilitate simple and fast fixing of the device with minimal disturbance to both the cooling target electronic component and the surrounding components. The device according to the present teaching thus facilitate improved performance of liquid-based heat sink device for effective targeted cooling of high-powered and computational expensive components such as CPUs and GPUs.

BRIEF DESCRIPTION OF THE DRAWINGS

The present application will now be described with reference to the accompanying drawings in which:

FIG. 1 is a simplified schematic showing an example of a CPU card holding various electronic components.

FIG. 2C is a perspective view of the device of FIG. 2A with all arms engaged.

FIG. 2D is a plan view from above showing the device of FIG. 2A in accordance with an embodiment of the present teaching.

FIG. 2E is a plan view from the bottom showing the device of FIG. 2A in accordance with an embodiment of the present teaching.

FIG. 4C is a partial horizontal sectional view of the device of FIG. 4A. FIG. 4C' is an amplified portion of the view of FIG. 4C.

FIG. 4D is a partial vertical sectional view of the device of FIG. 4A.

FIG. 5 is a simplified schematic showing a device according to an embodiment of the present teaching mounted on the CPU card of FIG. 1.

DETAILED DESCRIPTION

Figure 2A:
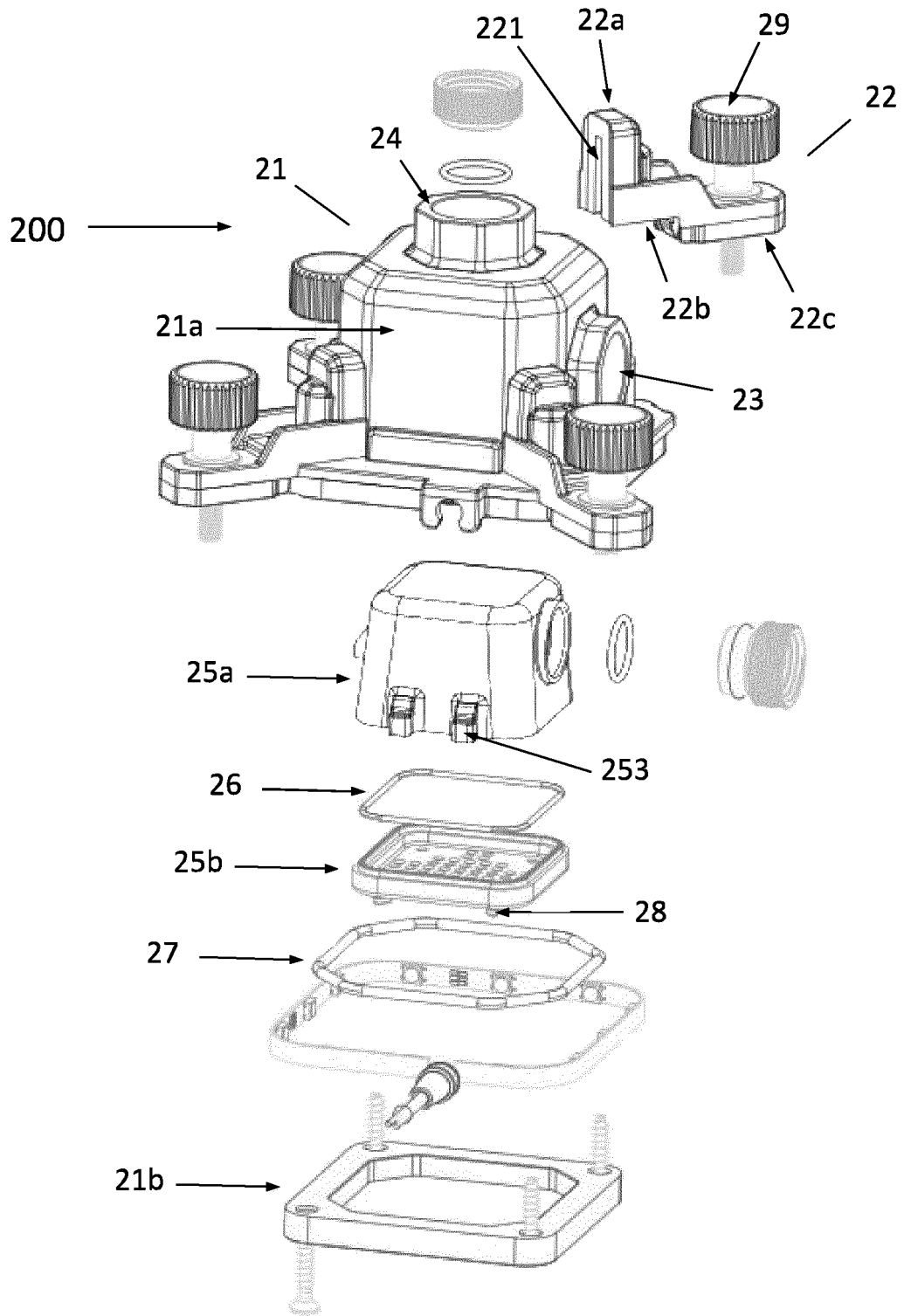
FIG. 2A is s a perspective view of a device in accordance with an embodiment of the present teaching with a disengaged arm.

The present invention will now be exemplified with reference to the accompanying drawings.

A number of terms used in describing various embodiments of the present invention may be used synonymously or interchangeably. For example, the term "circuit board" may be used synonymously with "printed circuit board", "board", or "motherboard". The term "electronic components" may be used synonymously with "electronics" to refer to various types "integrated circuits", "chips" or any other types of electronic components. The term "thermal heat sink device" may be used synonymously with "heat exchanger" and "cooling device". The term "cooling device", "heat-sink device", or "liquid-based cooler" may be used synonymously with "liquid cooler" or "waterblock". As used herein, and unless the context dictates otherwise, the term "coupled to" or "connected to" is intended to include both direct coupling or connection (in which two elements that are coupled or connected to each other contact each other) and indirect coupling or connection (in which at least one additional element is located between the two elements). Therefore, the terms "coupled to", "coupled with", "connected to" and "connected with" are used synonymously.

The following discussion provides many exemplary embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

According to an embodiment of the present teaching, a modular thermal heat sink device or cooling device for cooling electronic components on a circuit board is provided. FIG. 1 shows an example of a conventional circuit board 100 which may be a printed circuit board (PCB) configured as a motherboard. Such a board 100 is typically provided as a preassembled board that is then fixed within the housing of the computing device. Such a PCB is typically configured to provided one or more slots 120, such as PCI slots which are dimensioned to receive and retain respective hardware components such as network cards, modems, sound cards, disk controllers and other peripherals. The circuit board may also have directly coupled multiple integrated circuits or chips. Memory such as RAM 130 or ROM may also be provided on the board. Other electronic components that are typically deployed include a central processing unit (CPU), graphics processing unit (GPU) or the like. The specifics of the processing unit deployed with the motherboard will determine the application that it is being used primarily for. These processing units are typically the major source of heat of the motherboard and their performance is related to their operating temperature. For these reasons there is a reason to cool the motherboard and/or specific components of same. The example of FIG. 1 is a motherboard with a CPU 140, the type of which can be effectively cooled using a modular thermal heat sink device according to the present teaching. The use of heat sink devices per se to effect a cooling of a CPU 140 is not new, these devices are typically pre-designed for specific CPUs and are fixed relative to the motherboard using CPU mounting threads 150.

Per the present teaching, a new type of thermal heat sink devices that can be used with conventional motherboards is provided. An exemplary embodiment of a modular thermal heat sink device 200 according to the present teaching is shown in each of FIGS. 2A to 2E. The device is modular in that it comprises a number of components that can be releasably secured together to form the totality of the device. The housing of the device is modular and comprises a housing assembly and a plurality of removable arms. The housing assembly defines a body that comprises various cooling components for operatively effecting cooling of an electronic component on a circuit board, such as the heretofore referenced CPU of FIG. 1.

The device of the present teaching preferentially uses liquid cooling to effect the operative cooling. Liquid cooling is typically achieved by directing a liquid onto a thermal surface or substrate, the movement of the liquid relative to the thermal substrate effecting a cooling effect of that surface. For example, the liquid cooling device comprises a thermal cooling plate. The thermal cooling plate is configured to be thermally coupled to a thermal substrate which is a surface of an electronic component that requires operative cooling. The liquid cooling device further comprises a fluid inlet and a fluid outlet to facilitate fluid circulation to effect the operative cooling of the thermal substrate. For example, this can be achieved through passage of a fluid through an orifice plate. The passed fluid effectively cools the thermal cooling plate which is in thermal contact with the thermal substrate of the electronic component and operatively dissipate heat away from the thermal substrate.

Figure 2B:
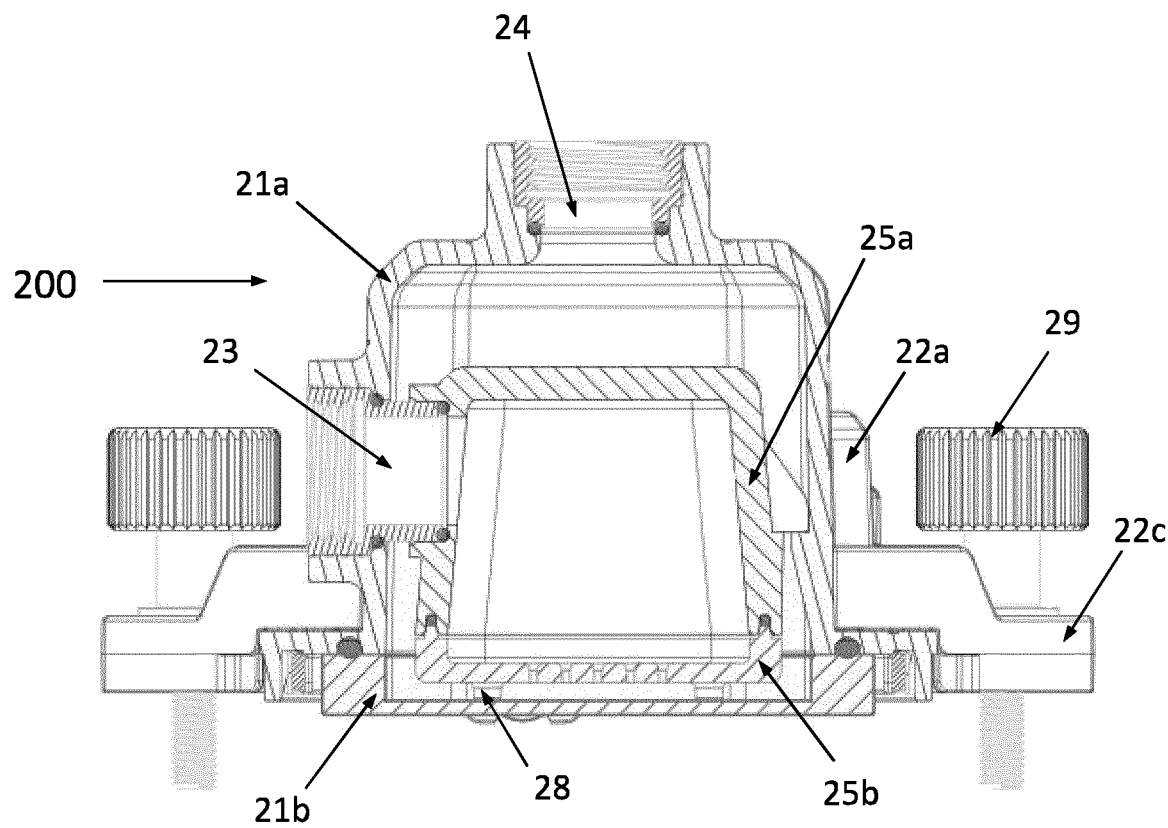
FIG. 2B is a vertical sectional view along a parallel centreline p as indicated in FIG. 2D of the device of FIG. 2A.

An example of a suitable liquid-based cooler is shown in the exploded view of FIG. 2A as well as the sectional view of FIG. 2B. The sectional view of FIG. 2B shows the cross section of the device of FIG. 2A along a centreline p as indicated in the top view of FIG. 2D. The impinging jet assembly of FIG. 2A comprises a housing assembly. The housing assembly may comprise an outer housing 21 and an inner chamber 25 which may also be referred to as a plenum chamber 25. The outer housing 21 and the plenum chamber 25 may each define an opening concentric to each other to facilitate a fluid inlet 23. The outer housing 21 and the plenum chamber 25 may be releasably coupled together at the fluid inlet 23 to facilitate fluid communication.

The outer housing 21 may comprise a housing upper portion 21a and a housing lower portion 21b. The housing upper portion 21a and the housing lower portion 21b may be releasably engaged with each other to form a liquid-tight engagement which may be referred to as a housing seal. The outer housing 21 may optionally be equipped with sealing parts such as an O-ring 27 to enhance the housing seal. The outer housing defines a volume to confine the plenum chamber 25. The housing upper portion 21a may define another opening to facilitate a fluid outlet 24. The housing lower portion 21b may define a thermal cooling plate configured to be in thermal contact with a thermal substrate. An example of such a thermal substrate is a top surface of a cooling target electronic component.

The fluid inlet 23 may be in fluid communication with the plenum chamber 25 which may be referred to as a plenum chamber. The plenum chamber 25 may be wholly defined within the outer housing 21. In a preferred embodiment, the plenum chamber 25 may be a modular chamber in that it may comprise a chamber upper portion 25a and a chamber lower portion 25b. The chamber upper portion 25a and the chamber lower portion 25b may be releasably engaged with each other to form a liquid-tight engagement which may be referred to as a chamber seal. The plenum chamber 25 may optionally be equipped with sealing parts such as an O-ring 26 to enhance the chamber seal. The chamber upper portion 25a may define an opening for facilitating the fluid inlet 23. The chamber lower portion 25a may comprise a jet orifice plate which defines a plurality of jet orifices. The jet orifices may be distributed across the surface of the jet orifice plate to form an impinging microjet array plate. The impinging microjet array provides a fluid outlet through which a pressurised liquid can operably exit the plenum chamber 25. On exiting the impinging microjet array, the pressurised fluid may contact the thermal cooling plate 21b which is operatively in thermal contact with a thermal substrate, the thermal substrate being a thermal surface of an electronic device. In this way, the thermal heat sink device operably dissipates heat away from that thermal substrate. The impinging jet assembly is configured to operably direct that heated fluid away to exit the assembly via the fluid outlet 24. It will be appreciated that the thermal surface of the electronic device may not be limited to a planar surface. It may comprise one or more raised surfaces or perturbations that operatively increase the area of the contact surface with which the pressurised fluid contacts. These raised surfaces or perturbations may adopt one or more different geometrical forms, such as for example dimples or fins that project upwardly towards the jet orifice plate. To effectively direct the heated fluid away from the thermal substrate of the electronic component, the housing may define at least one exit channel, the exit channel being configured to deliver fluid exiting the impinging microjet array to the fluid outlet 24. The high velocity of the jets enables the exceptionally high convective heat transfer coefficients to enable highly effective targeted cooling of the electronic component.

The housing assembly is configured to be mounted over the cooling target of the electronic component. The housing assembly can be secured relative to the cooling target through the fixing, engaging, or mounting means according to the various embodiments of the present teaching.

In addition to the features and configurations that will be appreciated from the discussion herein, the liquid-based cooling device may include features and components in accordance with those described in published International Patent Application PCT/EP2019/070713.

The outer housing 21 shown in FIG. 2A forms part of the cooling component in that it serves as the external chamber to facilitate liquid circulation. It should be noted that a designated housing which does not necessarily form part of the cooling components essential for facilitating fluid circulation may be provided to enclose the housing assembly. In other words, the housing may not form part of the components that are required in order to operatively effect the cooling function. Instead, the housing may serve mainly to secure, protect, and fix the body of the cooling device on a substrate. In such an embodiment, the designated housing may be coupled to the body via suitable mechanical or adhesive coupling means. A skilled person should be able to understand and implement such an embodiment based on the present teaching. Such an embodiment is thus not described in detail herewith.

For simplicity, the following sections adopts the term "housing assembly" to refer to either the housing assembly comprising the outer housing and inner plenum chamber of the thermal sink device or the designated housing within which the body of a thermal heat sink is enclosed.

Engaging Features

Further views of the housing of FIGS. 2A and 2B are shown in FIGS. 2C to 2E. The outer housing 21 comprises a plurality of first engaging features spaced about the perimeter of the outer housing 21. Each of the plurality of the engaging features of the housing is configured for forming an engagement with an engaging feature 221 of a respective removable arm 22. More specifically, an engaging feature of the housing and the respective engaging feature 221 of a removable arm are dimensioned to cooperate with each other to form an engagement. The detail of the engaging features and their engaging mechanisms will be described in detail in the following paragraphs.

The exemplary outer housing 21 shown in FIGS. 2A to 2D adopts substantially a cuboid shape. Accordingly, the rim of the housing, as shown in FIGS. 2D and 2E has substantially a rectangular shape. The engaging features of the exemplary housing are arranged at or proximal to the corners of the rectangular rim. It will be appreciated that other suitable shapes may be adopted. The present teaching is not to be construed to be limited by the shape or dimension of the housing.

FIG. 2A also shows details of an engaging feature 221 of a removable arm 22 according to an embodiment of the present teaching. The arm 22 comprises two ends 22a, 22c. The engaging feature is defined at one end 22a and is configured to engage with the engaging feature of the housing 21. This end 22a of the removable arm 22 may be referred to as a proximal end. The other end 22c of the removable arm 22 may be referred to as a distal end. The distal end is configured to effect an operative fastening of the arm 22 to a supporting surface on which the modular device is fixed.

The fastening of the distal end 22c of the removable arm 22 may be effected through application of a force on the distal end 22c. The force may be perpendicular to the supporting surface. Once each of the arms 22 has formed an engagement with the outer housing 21, by effecting the fastening each of the arms 22 on a supporting surface, the outer housing 21 is effectively fixed to the supporting surface. FIG. 2C shows the device of FIGS. 2A and 2B with engagements formed between all four arms 22 and the housing 21. FIGS. 2D and 2E show the top plan view and bottom plan view respectively of the same device with all four arms 22 engaged with the housing 21.

According to an embodiment of the present teaching, the engaging feature of the housing and the removable arms are configured such that on fixing the device to the supporting surface, the force applied to the distal end 22c of the arm also reinforces the engagement between the proximal end 22a of the arm and the housing 21. The result of this is that the position of the housing 21 is locked by the arms relative to the thermal substrate.

Compared with a single-piece design, the modular design of removable arms 22 is advantageous in that the housing of a cooling device can be easily modified by using removable arms of different shapes and dimensions and/or mounting means. The compatibility of the cooling device is thus greatly improved, meaning that that it is possible to easily adapt the same cooling device to fit to different computer cards or boards of different designs and layouts. However, compared with a single-piece design, a modular design inevitably requires additional assembly. This may cause additional disturbance and damaging effect to both the cooling target electronic components and the surrounding electronic components and this is undesirable.

The present teaching mitigates this potential side effect of a modular design with the unique engagement mechanism between the removable arms and the housing. As previously described, the fastening of the distal ends 22c of the removable arms 22 reinforces both the engagement between the arms 22 and housing 21 as well as the abutment between the rim of housing and the supporting surface. This means that once the modular device has been placed on a circuit board, the placing, securing, locking, and fixing of the entire modular device can be effected by a single step of fastening the distal ends 22c of the arms 22 on to the mounting surface. As a result, disturbance to the various electronic components on the circuit board is minimized. Further details of the removable arms and the engaging features will be described in the subsequent paragraphs.

Again with reference to FIG. 2A, a specific exemplary configuration of the engaging features of the housing and the removable arms is described herewith. In this particular embodiment, the engaging feature of the housing 21 defines a projection and the engaging feature 221 of the removable arm 22 defines a recess. The projection and the recess are dimensioned to cooperate and form an engagement with each other. In an alternative embodiment, the engaging feature 221 of the removable arm 22 defines a projection and the engaging feature of the housing 21 defines a recess.

Preferably, the projection and the recess are dimensioned such that a formed engagement between the engaging feature of the housing and that of a respective removable arm locks the position of the respective removable arm 22 relative to the housing 21.

According to some embodiments, the recess may be a groove. The groove may be a blind groove having a stop end and a through end. The projection may comprise a free end configured to fit and abut the stop end of the blind groove. Preferably, the groove and the projection are each dimensioned to form an elongated shape defining a longitudinal axis substantially perpendicular to the thermal cooling plate of the heat sink device. The engagement between the projection and the groove may be a sliding engagement along the longitudinal axis. In a particular embodiment, the free end and the stop end are configured to form an engagement for preventing lateral displacement between the housing and respective removable arm. For example, the free end of the projection and the stop end of the blind groove may be configured to form a pair of complimenting L-shaped locking features so as to prevent lateral displacement along the direction as indicated by the double-ended arrow. The inset of FIG. 2C shows a magnified view at a vertical cross section along the centreline of the removable arm. As shown in the inset, the L-shaped end of each of the projection and the groove cooperate with each other to form a lock to prevent lateral displacement between the housing and the removable arm in the direction indicated by the double-ended arrow.

As shown in FIG. 2A, the rim of the housing 21 may have an external flange 213. Each removable arm 22 may comprise a middle portion 22b defined between the proximal and distal ends 22a, 22c. The middle portion 22b is configured such that on fixing the device, a lower surface of the middle portion 22b of the arm abuts an upper surface of the flange 213 of the housing. A force applied to the distal end 22c of each of the removable arms 22 causes the lower surface of the middle portion 22b to press against the upper surface of the flange 213 and in turn reinforces the liquid-tight abutment formed between the housing 21 and the supporting surface.

According to some embodiments, on fixing the device to a supporting surface, the through end of the blind groove abuts the upper surface of the flange 213. The stop end of the blind groove is positioned such that a force applied to the distal end 22c of the arm 22 causes the stop end of the groove to press against the free end of the projection. Take again the device shown in FIG. 2A as an example, the arm 22 has an engaging feature 221 of a blind groove with the stop end positioned at the top and the through end at the bottom. The groove may slidably engage with the projection of the housing 21. The projection may have one free end, being the upper end in this example. Alternatively, the projection may have two free ends, the upper and lower free ends. In any case, when the engaging feature 221 of the arm and that of the housing are engaged, a fastening force applied to the distal end 22c of the arm 22 will cause the stop end of the groove of the arm to press against the upper free end of the projection feature of the housing 21. According to some alternative embodiments, the engaging feature of the housing defines a recess, i.e. a groove, and the engaging feature of the arm defines a projection. In such embodiments, the through end of the groove is positioned at the top and the stop end of the groove is position at the bottom. On fixing the device to the supporting surface, a force applied to the distal end 22c of the arm 22 will cause the lower free end of the projection to press against the stop end of the blind groove.

In the embodiments where the engaging feature 221 of the removable arm defines a groove and the engaging feature of the housing defines a projection, on fixing the device to the supporting surface, the through-end of the groove abuts the supporting surface or preferably the flange 213 of the housing to further reinforce the abutment between the housing 21 and the supporting surface.

According to a preferred embodiment, the outer housing 21 is a modular housing in that it comprises a housing upper portion 21a and a housing lower portion 21b. Such a modular housing design makes the heat sink device more versatile in that the user can change the thermal cooling plate 21b to modify or tune the thermal conductive property to suit various cooling applications. The housing upper portion 21a is configured to engage with the housing lower portion 21b at a rim of the housing upper portion 21a to form a liquid tight engagement or seal. The seal may be further improved by using sealing parts such as an O-ring 27. By fastening each of the arms 22 on or over a supporting surface, the outer housing 21 can be secured over the thermal surface of a cooling target to facilitate forming of a desired thermal coupling. The thermal coupling may be enhanced through using a thermal interface material (TIM).

A further advantageous effect simultaneously achieved by the fastening of the arms 22 on or over the supporting surface is that the housing liquid-tight seal formed between the housing upper portion 21a and the housing lower portion 21b is reinforced. The fastening of the arms 22 on or over the supporting surface thus not only secures the position of the housing 21 on the supporting surface but also ensures the liquid-tight seal of the housing 21.

As described earlier, the housing assembly may further comprise an inner plenum chamber 25. The plenum chamber 25 and the outer housing 21 may be releasably coupled/ engaged with each other. The coupling/engagement between the plenum chamber 25 and the outer housing 21 may be achieved via various means. In one embodiment, as one can see from the exploded view of FIG. 2A, the plenum chamber 25 has one or more shoulder features 253. These shoulder features 253 are configured to abut one or more corresponding recess features of the housing upper portion 21*a*. The formed abutment restricts upward movement of the plenum chamber 25. Accordingly, by fixing the removal arms 22 on or over a supporting surface, both the outer housing 21 and the plenum chamber 25 are simultaneously fixed. The abutment formed between the plenum chamber 25 and the outer housing 21 may be better shown in the sectional view of FIG. 4E and will thus be described further in the context of the embodiment of FIGS. 4A to 4E.

According to an embodiment, the inner plenum chamber 25 may be modular in that the chamber comprises a chamber upper portion 25*a* and a chamber lower portion 25*b*. The chamber upper and lower portions 25*a*, 25*b* are configured to releasably engaged with each other to form a chamber liquid-tight seal. As shown in FIG. 2A, the chamber liquid-tight seal is formed along the rim of the chamber upper portion 25*a*. The seal may be enhanced by sealing components such as an O-ring 26. The chamber lower portion 25*b* comprises an impinging jet plate defining an impinging jet array. The impinging jet plate is configured to facilitate passage of a cooling fluid to effect an operative cooling. For example, the liquid that has passed the impinging jet array is in thermal contact with the thermal cooling plate defined by lower portion 21*b* of the outer housing 21.

According to an embodiment, the plenum chamber 25 is configured such that on fixing the device to the supporting surface through application of a force on the distal ends 22*c* of the removable arms 22, the chamber formed between the chamber upper and lower portions 25*a*, 25*b* is simultaneously reinforced.

The effective cooling area offered by the heat sink device may be defined by the arrangement of the impinging jet array of the orifice plate 25*b*. The effective cooling area of the heat sink device may be configured to substantially overlap the cooling target which is a thermal substrate of an electronic component to achieve an effective targeted cooling. In practice, electronic components may adopt various designs and thus may have thermal substrates of various sizes and/or shapes. The modular plenum chamber 25 of the present teaching thus has the advantage of being capable of easily modified for cooling thermal substrates of different shapes and sizes. This can be achieved by simply replacing the lower portion 25*b* of the plenum chamber 25 with one having jet array of a suitable design. The remaining components of the modular heat sink device may remain unchanged. The heat sink device can thus be easily adapted to suit different electronic components in a flexible and cost-effective manner.

The housing assembly may comprise one or more spacers 28 provided between the chamber lower portion 25*b* and the housing lower portion 21*b*. The one or more spaces 28 are arranged to create a gap for facilitating a flow of the fluid that has passed through the orifice plate or impinging jet plate. The one or more spacers 28 also function to assist the reinforcement of the chamber seal by pressing the chamber lower portion 25*b* upwardly against the chamber upper portion 25*a*.

It should be noted that in some alternative embodiments, the plenum chamber 25 may be a single piece component. In such embodiments, the spacers 28 may be omitted as the single piece chamber 25 may be secured in place solely through a suitable coupling with the outer housing 21.

As described earlier, the modular heat sink device according to the present teaching can be fixed to a supporting surface through application of a force on the distal ends 22*c* of the removable arms 22. Advantageously, on fixing the device to the supporting surface, several fixing and reinforcing effects are simultaneously achieved, including at least reinforcing the engagement between the removable arms 22 and the housing 21, reinforcing the coupling between the housing 21 and the plenum chamber 25, reinforcing the liquid-tight housing seal of the housing 21, and reinforcing the liquid-tight chamber seal of the plenum chamber 25. A fixing and securing of the device over a cooling target can thus be achieved with minimal fastening procedure causing minimal disturbance to not only the heat sink device itself, but also the cooling target electronic component and the surrounding electronic component on the PCB.

In the exemplary embodiment shown in FIGS. 2A to 2E, the four arms 22 are configured to adopt the same shape and dimension. As one can see from the top plan view of FIG. 2D, each arm adopts substantially a straight profile. On forming engagements with the housing, the four arms 22 extend substantially radially from the centre of the housing 21.

According to some embodiments, the removable arms may not adopt other shapes. Furthermore, the shape and/or dimension of the removable arms may be different even for a single thermal heat sink device. For example, at least one of the removable arms may adopt a shape or dimension that is different from the others. FIGS. 3A to 3D show an embodiment of a device which may have similar housing and removable arm engaging features as those described in connection with FIGS. 2A to 2D. However, the removable arms 32 of each of FIGS. 3A to 3D are configured to adopt different shapes.

Figure 3A:
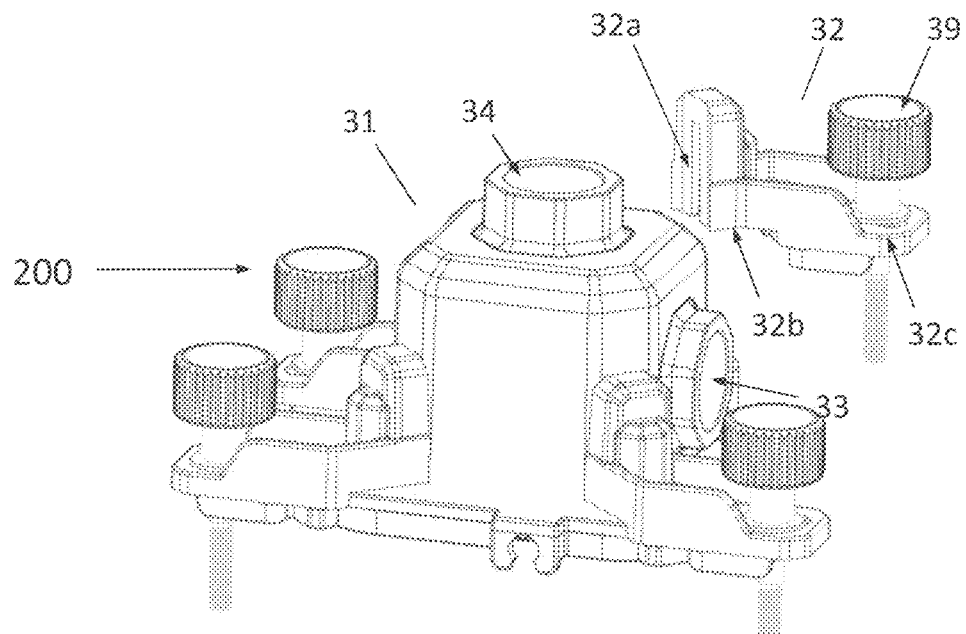
FIG. 3A is s a perspective view of a device in accordance with a second embodiment of the present teaching with a disengaged arm.
Figure 3B:
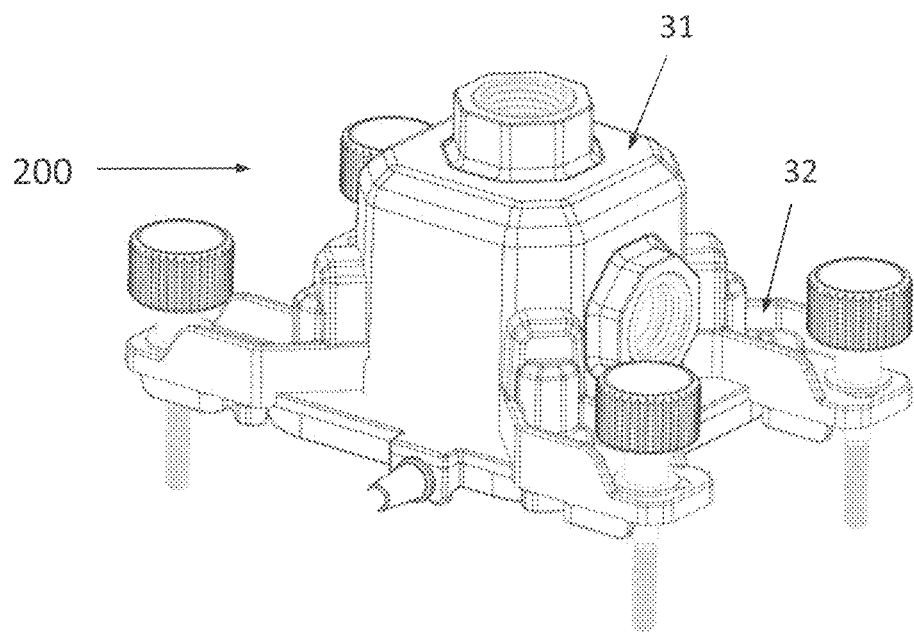
FIG. 3B is a perspective view of the device of FIG. 3A with all arms engaged.
Figure 3C:
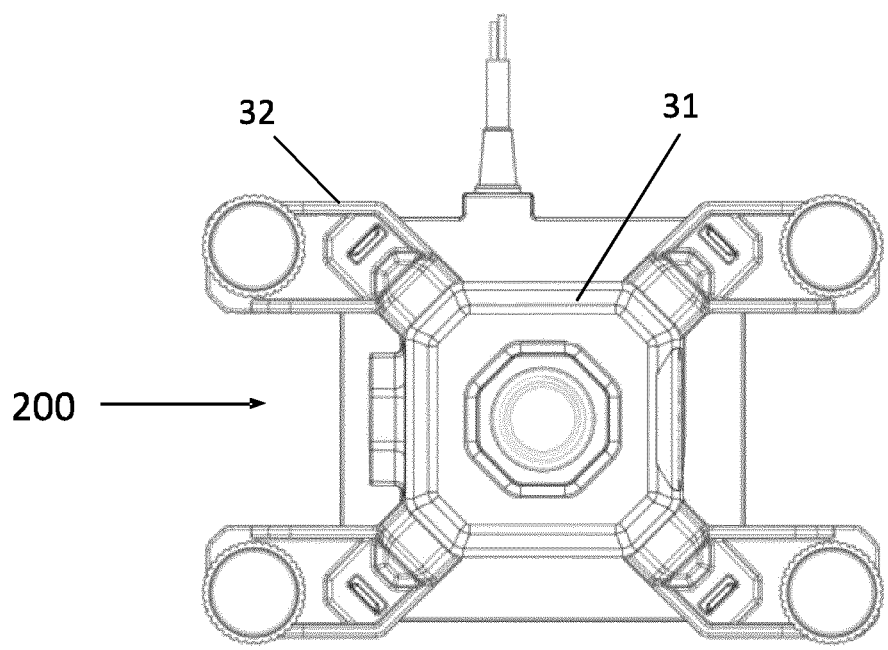
FIG. 3C is a plan view from above showing the device of FIG. 3A in accordance with an embodiment of the present teaching.
Figure 3D:
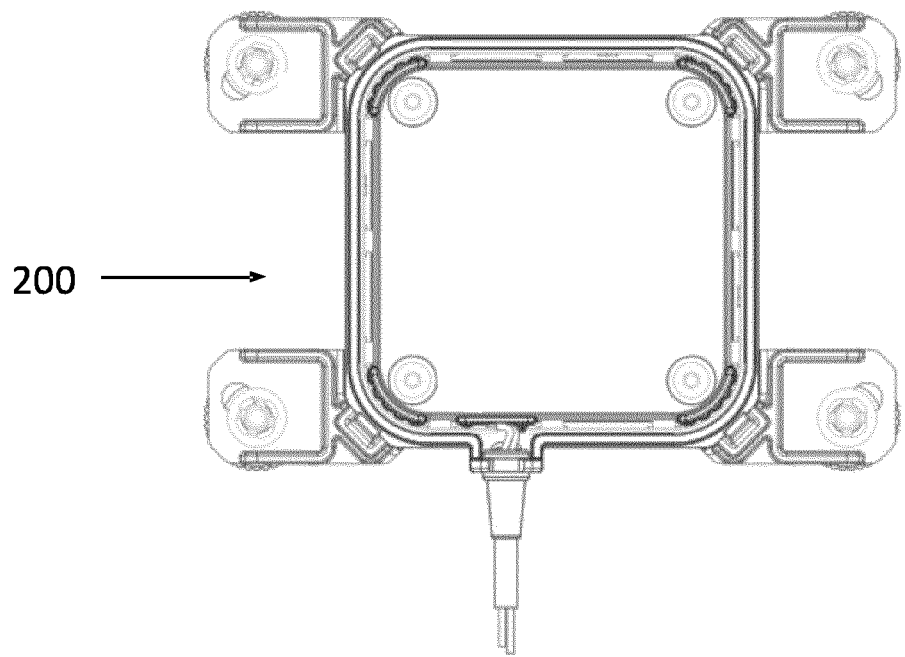
FIG. 3D is a plan view from the bottom showing the device of FIG. 3A in accordance.

The difference in the shape of the removable arms may be more easily perceivable from the top plan view shown in FIG. 3C. As one can see from FIG. 3C, each of the arms 32 has an angled profile instead of the straight profile of the embodiment as shown in FIG. 2D. On effecting engagements between the arms 32 and the housing 31, the device has a footprint of a different shape compared with that of the embodiment depicted in FIGS. 2A to 2E. Therefore, by using removable arms of various shapes and/or dimensions, it is possible to adapt the cooling device to suit various circuit board layouts to effect mounting that otherwise wouldn't be possible with the existing thermal heat sink device designs. Versatility and compatibility of the cooling device is therefore greatly improved by adopting the modular design with removable arms according to the present teaching.

Although exemplified with four removable arms, a device according to the present teaching may comprise other number of removable arms. Different numbers of removable arms may be adopted to suit different shapes of the housing for cooling electronic components of other surface profile. Different number of removable arms may also be adopted to suit different circuit board designs or layouts.

In yet some further embodiments, the housing 21, 31 may comprise a number of redundant engaging features, meaning that on mounting the device, only a subset of the total number of engaging features (primary engaging features) are used to effect a particular mounting. The remaining engaging features that are redundant in effecting this particular mounting may serve as auxiliary engaging features in the event one or more primary engaging features fail. The redundant engaging features that serve as secondary engaging features in effecting one mounting may server as the primary engaging features in effecting a different mounting. A different mounting may occur when, for example, effecting a mounting for cooling a different electronic component or on a different mounting surface with a different mounting layout. Depending on the circuit board on which the thermal heat device is to be fixed, a user may selectively effect some or all of the engaging features. Such a configuration further improves the compatibility and adaptability of the modular device to suit various mounting needs.

Torque Screw

As aforementioned, the fixing of the device on the supporting surface is effected through application of a force on the distal end 22c, 32c of each of the arm 22, 32. To effect this, the distal end 22c, 32c of each removable arm 22, 32 may define a means for operatively effecting a fastening of the distal end 22c, 32c on a mounting surface.

According to an embodiment, as shown in any of FIGS. 2A to 2E, and 3A to 3D, each of the distal ends 22c, 32c defines a mounting hole for receiving a fastener. In a preferred embodiment, the fastener is a torque screw 29, 39. A torque screw allows tightening the screw to a specified torque. Therefore, by using a torque screw, a user can control of the amount of torque applied to ensure that tightening is sufficient but not excessive. As previously mentioned, the electronics on a computer board/card are typically delicate and prone to mechanical damage, a desirable effect achieved by using torch screws is that potential damaging effect on a cooling target electronic component cause by excessive force applied during mounting can be prevented. A further advantage of using torque screws is that, as the torque can be set to a specific value or range, it is possible to effect a mounting with a specific tightening force profile across the removable arms of the device. This is particularly useful in achieving a more effective thermal coupling between the cooling surface of the thermal heat sink device and the thermal surface of the cooling target electronic component.

As described earlier, the engaging features of the present teaching are configured such that the tightening force applied on the distal ends of the removable arm affects the engagement and abutment formed on the proximal ends. As described earlier, the engagement and abutment on the proximal ends of the removable arms affects the thermal coupling formed between the cooling device and the cooling target electronic component which ultimately impacts the cooling effectiveness. Therefore, by allowing to control the amount of torque applied for fastening each of the removable arms to a specific value or at least a specific range of values, the thermal coupling between the thermal heat sink device and the electronic component can be improved for an improved cooling effectiveness of the thermal heat sink device.

In a further embodiment according to the present teaching, there is provided a modular heat sink device with a number of additional features configured to further reinforce and secure the engagement described in connection with FIGS. 2A to 2E or 3A to 3D. This further embodiment will be described making reference to FIGS. 4A to 4E.

Figure 4A:
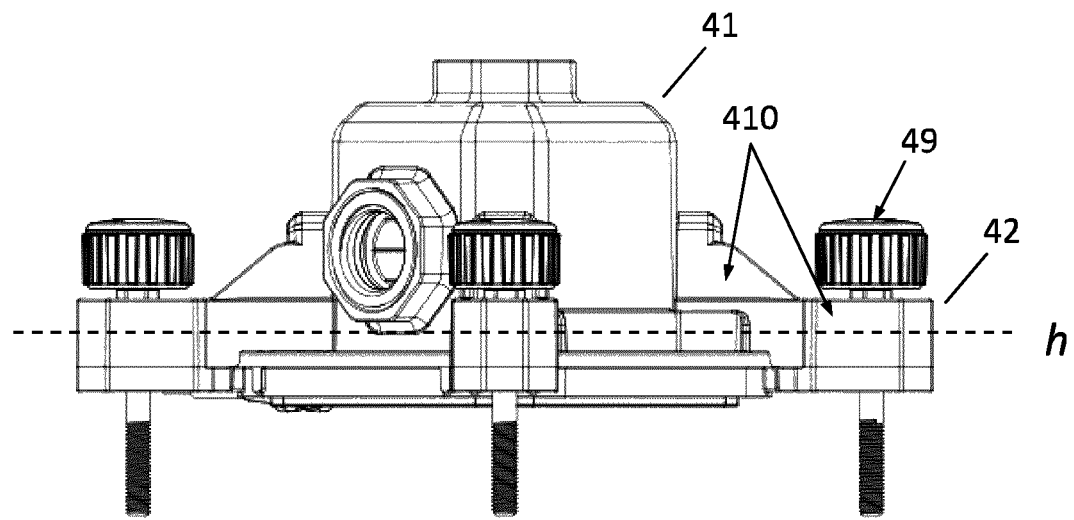
FIG. 4A is a side view of a device in accordance with a third embodiment of the present teaching.

FIG. 4A shows a side view of a device in accordance with such a further embodiment. As one can see, the modular heat sink device shown in FIG. 4A is similar to that shown in FIGS. 2A to 2E. However, a difference exists in that, the removable arms of the device of FIG. 4A have raised side walls 410 along either side extending from the proximal end to the distal end of the removable arm. The raised side walls provide additional strength to the removable arms. Apart from these raised side walls, the exterior configuration of the device of FIG. 4A is substantially the same as that of FIGS. 2A to 2E. Accordingly, the top plan views of the two embodiments as shown in FIG. 2D and FIG. 4B are substantially the same.

Figure 4B:
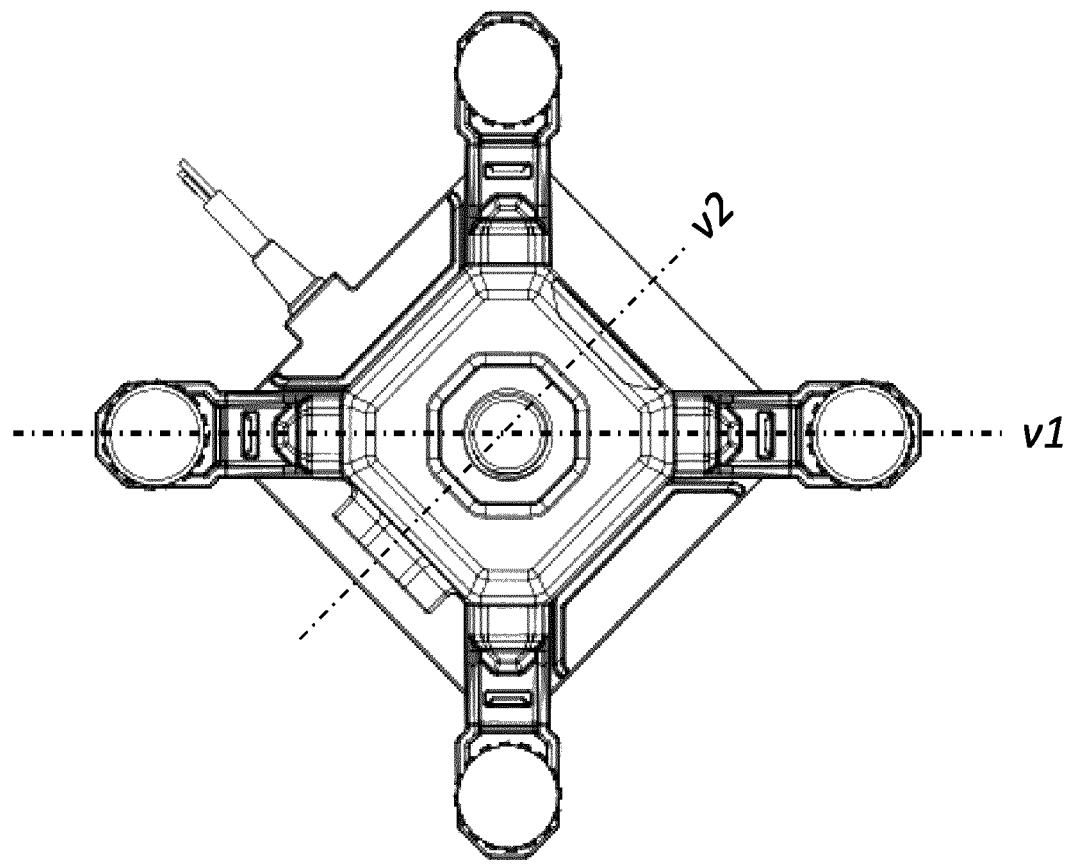
FIG. 4B is a plan view from above showing the device of FIG. 4A.
Figure 4E:
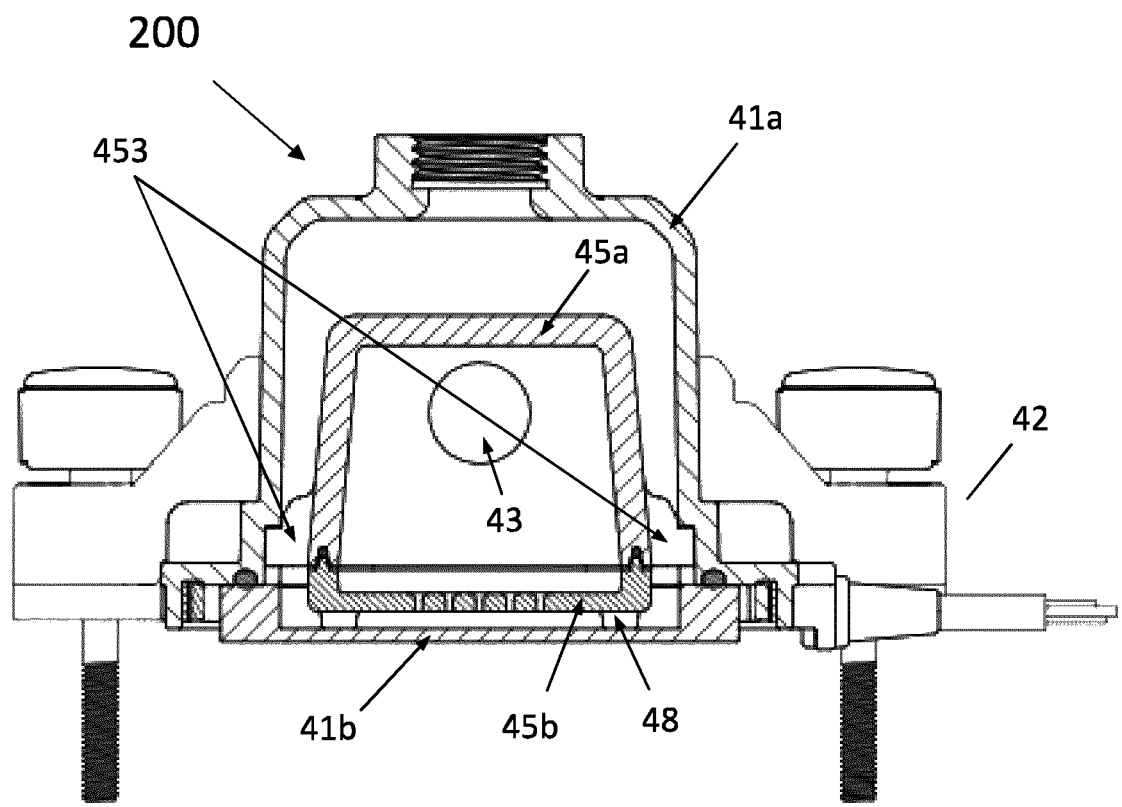
FIG. 4E is a vertical sectional view of the device of FIG. 4A.

In addition to the raised side walls, the embodiment shown in FIGS. 4A and 4B has a number of further engaging details compared with that of FIGS. 2A to 2E. These further engaging details are described below in connection with the sectional views shown in FIGS. 4C and 4D. FIG. 4C shows a partial sectional view of the device of FIG. 4A along a horizontal plane h as indicated in FIG. 4A. The sectional view shows an engagement formed between the housing 41 and a removable arm 42. FIG. 4C' shows an amplified portion of the engaging detail of FIG. 4C. In this particular embodiment, the lower portion of the engaging feature of the housing has a T-rail configuration 412. The flange portion of the T-rail is modified to form a half-cylinder shape to accommodate a fastening means such as a threaded screw fastener 450. The engaging feature of the removable arm is in a form of a matching recess 422 configured for receiving the T-rail to form a slidable engagement. Each of the two ends of the flange portion of the T-rail may be further configured to adopt an L-shaped locking feature 413 for preventing lateral displacement between the housing and the removable arm. This in turn reinforces the engagement formed between the arm and the housing.

FIG. 4D shows a partial sectional view along a vertical plane v1 along the centreline of two opposite removable arms as indicated in FIG. 4B. Features 411 and 421 are cooperating engaging features for preventing lateral displacement in the radiating direction along the removable arm. The threaded screw 450 as already mentioned in connection with FIG. 4C' is used to secure the housing upper and lower portions 41a, 41b together. FIG. 4D further shows a snap fitting clamp 430 between the housing and the removable arm. This snap fitting clamp 430 is configured to prevent vertical displacement between the housing and the arm.

The remaining features shown in FIG. 4D are substantially similar to those of the embodiment of FIG. 2A. For example, the housing upper and lower portions 41a, 41b form a liquid-tight housing seal which may be enhanced by an O-ring 47. Similarly, the upper and lower chamber portions 45a, 45b form a liquid-tight chamber seal which may be enhanced by an O-ring 46. The chamber lower portion 45b has an orifice plate functioning as an impinging jet plate for passing a cooling fluid. The chamber lower portion 45b comprises one or more spacers 48 that are similar to the spacers 28 described in conjunction with FIG. 2A.

As mentioned earlier, the sectional view of FIG. 4E shows the abutment formed between the plenum chamber 45 and the outer housing 21. The abutment is achieved by the shoulder features 453 of the plenum chamber 45 and the corresponding recess features of the outer housing 41. More specifically, the shoulder features 453 are configured to abut one or more recess features formed close to the rim of the housing upper portion 41a. The formed abutment restricts upward movement of the plenum chamber 45. The result of this abutment formed between the plenum chamber 45 and the outer housing 41 is that, by fixing the removal arms 42 on or over a supporting surface, both the outer housing 41 and the plenum chamber 45 are simultaneously fixed.

It should be noted that the above described additional engaging details may be combined, individually or in combination, with the embodiment of FIGS. 2A to 2E or FIGS. 3A to 3D to form further functioning embodiments.

Preferably, similar to the embodiments described earlier, the removable arms of the embodiments of FIGS. 4A to 4E are configured to facilitate fastening using torque screws for achieving advantageous fastening effects similar to those demonstrated earlier.

FIG. 5 shows a simplified schematic diagram of the exemplary CPU card of FIG. 1 with a device according to the present teaching mounted over the CPU.

Whilst the present teaching has been exemplified with reference to dissipating heat away from an electronic component, it will be appreciated that any heated surface that requires cooling can benefit from the present teaching. In this way for example, a server module that comprises side walls defining an enclosure volume within the module within which assorted electronic components typically requires cooling. A device such as the present teaching can be provided within the server module enclosure to cool specific ones of the electronic components or could be thermally coupled to the side walls to provide a cooling of the overall module.

The words comprises/comprising when used in this specification are to specify the presence of stated features, integers, steps or components but does not preclude the presence or addition of one or more other features, integers, steps, components or groups thereof.

The invention claimed is:

1. A modular liquid-cooled thermal heat sink device configured to thermally engage with a thermal substrate, the device comprising:
    a housing assembly having a body defining a volume, the housing assembly comprising a thermal cooling plate configured to be in thermal contact with the thermal substrate, a fluid inlet and a fluid outlet, the housing assembly being configured to facilitate fluid circulation within the body to effect an operative cooling of the thermal substrate through the thermal cooling plate, the body comprising a plurality of first engaging features spaced about a perimeter of the body, the housing assembly comprising an outer housing and an inner chamber, the outer housing defining the body, the inner chamber being configured to detachably coupled to the outer housing;
    a plurality of removable arms each comprising a first and second end, each of the plurality of arms being configured to mate with the body at a respective one of the plurality of first engaging features, wherein each of the first ends defines a second engaging feature dimensioned to cooperate and form an engagement with a respective first engaging feature, and wherein each of the second ends is configured to effect an operative fixing of the device to a supporting surface through application of a force on each of the second ends, the force being perpendicular to the supporting surface;
    wherein each second engaging feature defines a groove and the first engaging feature defines a projection dimensioned to be at least partially received within the groove;
    wherein the groove is a blind groove comprising a stop end and a through end;
    and the projection comprises a free end configured to fit and abut the stop end of the blind groove, the groove and the projection being configured such that on fixing the device to the supporting surface, the force causes the stop end of the blind groove and the free end of the projection to press against each other to reinforce the engagement formed between the respective arm and the body.

2. The device of claim 1, wherein each of the first and second engaging features are configured such that, on fixing the device to the supporting surface, the force reinforces the engagement between the arms and the body.

3. The device of claim 1, wherein the body of the outer housing comprises a housing upper portion and a housing lower portion, the housing lower portion comprising the thermal cooling plate, the housing upper and lower portions being configured to releasably engaged with each other to form a housing liquid-tight engagement.

4. The device of claim 3, wherein on fixing the device to the supporting surface, the force reinforces the housing liquid-tight engagement formed between the housing upper and lower portions.

5. The device of claim 1, wherein the inner chamber comprises a chamber upper portion and a chamber lower portion configured to releasably engage with each other to form a chamber liquid-tight engagement, the chamber lower portion comprising an orifice region configured to facilitate passage of a fluid to be in thermal contact with the thermal cooling plate to effect the operative cooling.

6. The device of claim 5, wherein the inner chamber and the outer housing are releasably coupled to each other such that, on fixing the device to the supporting surface, the force reinforces the chamber liquid-tight engagement formed between the chamber upper and lower portions.

7. The device of any of claim 6, comprising one or more spacers between the chamber lower portion and the housing lower portion to create a gap for facilitating a flow of the fluid that has passed through the orifice region, the one or more spacers configured to facilitate the reinforcement of the chamber liquid-tight engagement.

8. The device of claim 5, wherein the orifice region defines an effective cooling region, the effective cooling region is dimensioned to substantially overlap the surface area of the thermal substrate.

9. The device of claim 1, wherein the groove and the projection are dimensioned such that the formed engagement locks the position of the respective arm relative to the housing assembly.

10. The device of claim 1, the groove and the projection each dimensioned to form an elongated shape defining a longitudinal axis substantially perpendicular to the thermal cooling plate, wherein the engagement is a slidable engagement between the projection and the groove along the longitudinal axis.

11. The device of claim 1, wherein the application of the force on each of the second ends of the plurality of removable arms is affected by a respective torque screw of a plurality of torque screws.

12. The device of claim 11, wherein the plurality of torque screws are configured to operatively tighten to a specific torque.

13. The device of claim 11, wherein:
    a first torque screw of the plurality of torque screws is configured to be tightened to a first specific torque; and
    a second torque screw of the plurality of torque screws is configured to be tightened to a second specific torque different from the first torque.

14. The device of claim 1, wherein upon fixing the housing assembly to the supporting surface to facilitate a thermal contact between the thermal cooling plate and the thermal substrate, a lower surface of each removable arm is suspended over the supporting surface.

15. The device of claim 1, wherein at least two of the plurality of arms are in different shape and/dimension.

\* \* \* \* \*